July 15, 1969 J. M. WELTY 3,456,166

JUNCTION CAPACITOR

Filed May 11, 1967

INVENTOR
JOSEPH M. WELTY

BY

Flehr, Hohbach, Test, Albritton & Herbert

ATTORNEYS 3,456,166

JUNCTION CAPACITOR

Joseph Melvin Welty, Los Altos Hills, Calif., assignor to Teledyne, Inc., a corporation of Delaware Filed May 11, 1967, Ser. No. 637,651
Int. Cl. H01l 5/06, 11/10
U.S. Cl. 317—234 4 Claims

ABSTRACT OF THE DISCLOSURE

A junction capacitor for integrated circuits which comprises a buried layer of one conductivity type semiconductor material in a block of semiconductor material of opposite conductivity type to form rectifying junctions which extend on both sides of the layer to provide a junction having a relatively large area. A post of the one conductivity type extends through the block to provide a means for connecting to the layer the post forming a second junction of much smaller area with the block. The junctions form a capacitor in series between ohmic connections made to the block and buried layer. On application of a voltage between the layer and the block, the depletion layers of the first junction around the layer merge to cause the total junction area and therefore capacitance of the device to be that of the post region only.

A problem often encountered in various circuits is the requirement of having a capacitor which can store a large charge but will then present a minimal capacitance after the initiation of an input voltage pulse. For example, capacitors are now used in transistor circuitry for aiding in the removal of minority carrier charge stored in the base of the transistor to allow the output signal to change quickly between logic states. This is termed a charge compensating capacitor or a commutating capacitor. Naturally, the larger the capacitance value, the faster the commutation; however, this has the deleterious effect of lengthening the settling time of the circuit which has an overall effect of decreasing its efficiency in the switching circuit.

It is therefore a general object of this invention to provide an improved junction capacitor for integrated circuits.

It is another object of this invention to provide a capacitor of the above type which is variable between two capacitance values.

It is another object of this invention to provide a junction capacitor which is suitable for use either in the monolithic type integrated circuit or a hybrid type integrated circuit.

In accordance with the above objects there is provided a junction capacitor having a capacitance variable between a first value and a second value at least an order of magnitude less than said first value. A semiconductive substrate of one type conductivity material has buried in it a layer of opposite type conductivity material. This layer forms a first rectifying junction with the substrate on one side of the layer and a second rectifying junction with the substrate on the other side of the layer. The first and second rectifying junctions are spaced apart a predetermined distance and are coupled at their extremities to form a continuous junction capacitor having a first value.

A columnar or post like region of the one type conductivity extends through the substrate to one side of the layer. This region has an average cross-sectional dimension greater than said predetemined spacing and forms a third rectifying junction with the substrate. Means for applying a voltage between the materials of two conductivity types are provided to form depletion layers at the junctions whereby a voltage of a predetermined magnitude causes the depletion layers at the first and second junctions to merge creating a pinch-off condition but to remain apart in said columnar region. Thus a junction capacitor is provided between the materials of the two conductivity types which is determined substantially by the third junction and which has a capacitance of second value.

Additional objects of the invention will appear from the following description.

Referring to the drawings.

Figure 1:
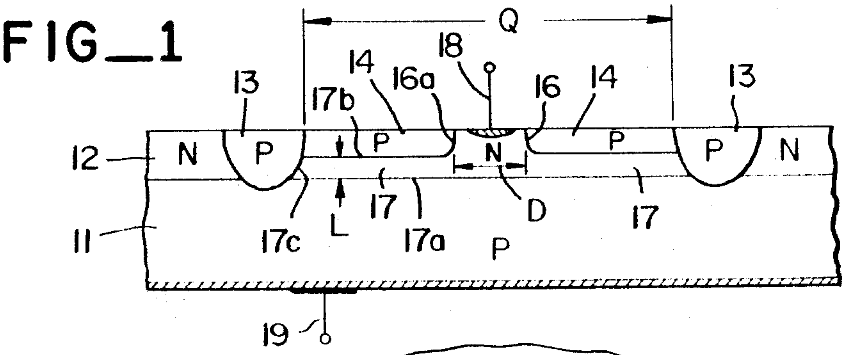
FIGURE 1 is a cross-sectional view of an integrated circuit embodying the junction capacitor of the present invention.
Figure 2:
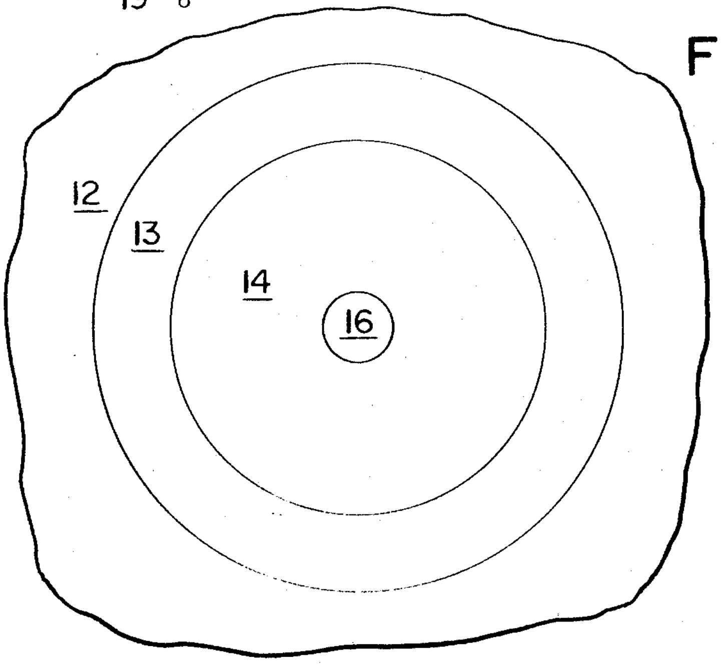
FIGURE 2 is a top view of FIGURE 1.

The junction capacitor device illustrated in FIGURES 1 and 2 includes a substrate block 11 of one conductivity type material, for example, P-type, having an epitaxial layer 12 of the opposite conductivity, N-type. A surface diffusion on epitaxial layer 12 provides closed isolating P-type regions 13 which merge with substrate 11. A subsequent P-type diffusion forms region 14 to leave a columnar or post region 16 of N-type conductivity extending to one surface. The P-type diffusion 14, provides, in effect, a buried layer 17 surrounded by the P-type material of region 11, 13 and 14. Ohmic contact is made to post 16 by a lead 18 and to substrate 11 by a lead 19.

Layer 17 forms a first rectifying junction **17*a* with P-type substrate 11 and a second rectifying junction 17*b* with P-type region 14. Rectifying junctions 17*a* and 17*b* are coupled at their extremities by the rectifying junction 17*c* formed by isolating region 13 to thus form a continuous junction capacitor having a value determined by the area of the rectifying junctions 17*a*, 17*b*, 17*c*. When a voltage is applied between leads 18 and 19, a depletion layer is formed at each of these junctions 17*a*, 17*b*, 17*c* and, in addition, at the junction 16*a* which the columnar region 16 forms with the region 14. The average cross-sectional dimension, D, of the circular columnar region is made larger than the separation, L, between rectifying junction 17*a*, 17*b*. Thus when a certain magnitude of voltage is applied between leads 18 and 19, the depletion layers between the junction 17*a* and 17*b* will merge. This occurs before the depletion layer formed at junction 16*a* merges. This merging of the depletion layers causes the capacitive junctions to lose their capacitive effect and the remaining capacitance effect is contributed only by the junction 16*a***.

Figures 3, 4:
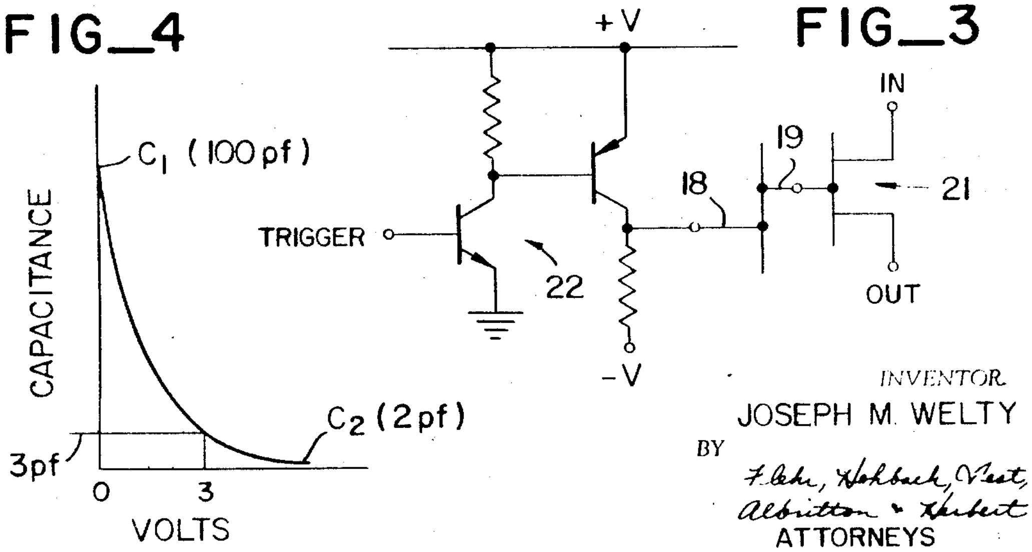
FIGURE 3 is a circuit embodying the capacitor of the present invention.
FIGURE 4 are characteristic curves useful in understanding the invention.

FIGURE 4 illustrates this effect with the application of a voltage between leads 18 and 19 where initially the capacitance, $C_1$, is determined by the combination of all of the junctions **16*a*, 17*a*, 17*b*, 17*c* and at a later time after application of the voltage and formation of the depletion layers the final capacitance is, $C_2$, which is determined by junction 16*a***.

Thus initially, the junction capacitor of the present invention is of a large capacitance value, $C_1$. This capacitance is, after application of a voltage, reduced to a significantly smaller capacitance, $C_2$, at least in order of magnitude smaller than $C_1$.

FIGURE 3 illustrates a typical circuit which would utilize the junction capacitor of the present invention showing how leads 18 and 19 couple the capacitor between a field effect transistor 21 and an inverter circuit 22.

The device of the present invention has been constructed and has the following dimensions and operating characteristics:

| | | |
|---|---|---|
| Q | millimeters | .762 |
| L | do | 0.001 |
| D | do | .1 |
| $C_1$ | picofards | 100 |
| $C_2$ | do | 2 |

Final voltage between terminals 18 and 19 is 50 volts maximum. Q is the effective character of capacitor $C_1$ and the ratio of $Q/D$ is a figure of merit of the device.

Thus the present invention provides a juncion capacitor suitable for use in integrated circuits which is easily varied between large and small values for improved circuit performance.

I claim:

1. In a junction capacitor for integrated circuits having a capacitance variable between a predetermined first value and a second value at least an order of magnitude less than said first value, a semiconductive substrate of one type conductivity material, a layer of opposite type conductivity material buried in said substrate said layer forming a first rectifying junction with said substrate on one side of said layer and a second rectifying junction with said substrate on the other side of said layer, said first and second rectifying junctions being spaced apart a predetermined distance and being coupled at their extremities to form a continuous junction capacitor of said first value, a columnar region of said one type conductivity extending through said substrate to one side of said layer, said region having an average cross-sectional dimension greater than said predetermined spacing, said region forming a third rectifying junction with said substrate, means for applying a voltage between said material of said one conductivity type and said opposite conductivity type to form depletion layers at said junctions whereby application of a voltage of a predetermined magnitude causes the depletion layers at said first and second junctions to merge creating a pinch-off condition but to remain apart in said columnar region to provide a junction capacitor between said materials of said two conductivity types determined substantially by said third junction and having a capacitance of said second value.

2. A junction capacitor as in claim 1 where said means for applying said voltage includes a first conductive lead coupled to said substrate and a second conductive lead coupled to said columnar region.

3. A junction capacitor as in claim 1 where said buried layer is epitaxial and is buried by a subsequent diffusion of material of said one conductivity type such diffusion being prevented in said columnar region.

4. In a junction capacitor for integrated circuits having a capacitance variable between a predetermined first value and a second value at least an order of magnitude less than said first value, a semiconductive substrate of one type conductivity material, an epitaxial layer of material of opposite type conductivity forming a first rectifying junction with said substrate, an isolation region of said one type conductivity material inset into said epitaxial layer and extending through said first junction, a region of said one type conductivity material inset into said epitaxial layer and forming a second rectifying junction with said epitaxial layer, said second junction being parallel to said first junction and spaced from said first junction a predetermined distance, said first and second junctions being coupled at their extremities to form a junction capacitor of said first value, a columnar region of said one type conductivity extending through said substrate to one side of said layer, said region having an average cross-sectional dimension greater than said predetermined spacing, said region forming a third rectifying junction with said substrate, means for applying a voltage between said material of said one conductivity type and said opposite conductivity type to form depletion layers at said junctions whereby application of a voltage of a predetermined magnitude causes the depletion layers at said first and second junctions to merge creating a pinch-off condition but to remain apart in said columnar region to provide a junction capacitor between said materials of said two conductivity types determined substantially by said third junction and having a capacitance of said second value.

References Cited

UNITED STATES PATENTS

| | | | |
|---|---|---|---|
| 3,253,197 | 5/1966 | Haas | 317—235 |
| 3,283,223 | 11/1966 | Witt et al. | 317—235 |
| 3,354,362 | 11/1967 | Zuleeg | 317—235 |

JAMES D. KALLAM, Primary Examiner

U.S. Cl. X.R.

317—235